(12) United States Patent
Abbas et al.

(10) Patent No.: US 8,962,487 B2
(45) Date of Patent: Feb. 24, 2015

(54) METHOD FOR MAKING MICROCHANNELS ON A SUBSTRATE, AND SUBSTRATE INCLUDING SUCH MICROCHANNELS

(75) Inventors: Abdennour Abbas, Villeneuve d'Ascq (FR); Didier Guillochon, Maroq en Baroeul (FR); Bertrand Bocquet, Villeneuve d'Ascq (FR); Philippe Supiot, Mons en Boroeul (FR)

(73) Assignee: Universite des Sciences et Technologies de Lille, Villeneuve d'Ascq (FR)

( * ) Notice: Subject to any disclaimer, the term of this patent is extended or adjusted under 35 U.S.C. 154(b) by 0 days.

(21) Appl. No.: 13/202,951
(22) PCT Filed: Feb. 24, 2010
(86) PCT No.: PCT/FR2010/050319
§ 371 (c)(1),
(2), (4) Date: Oct. 26, 2011
(87) PCT Pub. No.: WO2010/097548
PCT Pub. Date: Sep. 2, 2010

(65) Prior Publication Data
US 2012/0043649 A1 Feb. 23, 2012

(30) Foreign Application Priority Data
Feb. 25, 2009 (FR) .................................. 09 51200

(51) Int. Cl.
*H01L 21/311* (2006.01)
*H01L 29/06* (2006.01)
*B81C 1/00* (2006.01)

(52) U.S. Cl.
CPC ..... *B81C 1/00071* (2013.01); *B81B 2201/0214* (2013.01); *B81B 2201/058* (2013.01); *B81B 2203/0338* (2013.01); *B81C 2201/0108* (2013.01); *B81C 2201/018* (2013.01)
USPC ............. 438/703; 438/99; 438/422; 438/780; 257/522; 257/618; 257/E21.581

(58) Field of Classification Search
CPC .................. B81C 1/00071; B81B 2203/0338; B81B 2201/0214
USPC ................. 257/759, 414–417, 419, 522, 618, 257/E23.013, E21.573, E21.581; 438/780, 438/789, 790, 99, 50–53, 82, 681, 421–422, 438/703
See application file for complete search history.

(56) References Cited

U.S. PATENT DOCUMENTS 6,204,200 B1 3/2001 Shieh et al.
6,445,072 B1 * 9/2002 Subramanian et al. ....... 257/758
(Continued)

OTHER PUBLICATIONS

Mille et al., "New technology for high throughput THz BioMEMS", Engineering in Medicine and Biology Society, 2006. EMBS '06. 28th Annual International Conference of the IEEE, IEEE, Piscataway, NJ, USA, Aug. 30, 2006, pp. 3505-3508.

*Primary Examiner* — Jose R Diaz
(74) *Attorney, Agent, or Firm* — Westerman, Hattori, Daniels & Adrian, LLP

(57) ABSTRACT

The present invention relates to a process for fabricating microchannels on a substrate and to a substrate comprising these microchannels, the invention being especially applicable to the fabrication of microstructured substrates for microelectronic, microfluidic and/or micromechanical systems.

The process includes a step (a) of producing at least one or at least two patterns 2 on the surface of a bottom layer 1 and a step (b) of depositing, on top of the bottom layer and the pattern or patterns, a layer 3 of polymer material obtained by polymerizing an organic or organometallic monomer that contains siloxane functional groups, for example tetramethyldisiloxane, in a plasma-enhanced, optionally remote plasma-enhanced, chemical vapor deposition reactor (PECVD or optionally RPECVD) reactor.

The layer of polymer material is deposited so as to create, in place of the pattern and after development by decomposing this pattern, or between the two patterns without development/decomposition, a channel 4a, 4b, 4c, 4d closed over at least part of its length.

10 Claims, 3 Drawing Sheets

(56) References Cited

U.S. PATENT DOCUMENTS

| | | | |
|---|---|---|---|
| 6,815,329 B2 * | 11/2004 | Babich et al. | 438/619 |
| 6,930,061 B2 * | 8/2005 | Cheung et al. | 438/789 |
| 8,399,349 B2 * | 3/2013 | Vrtis et al. | 438/619 |
| 2002/0025529 A1 | 2/2002 | Quake et al. | |

* cited by examiner

METHOD FOR MAKING MICROCHANNELS ON A SUBSTRATE, AND SUBSTRATE INCLUDING SUCH MICROCHANNELS

The subjects of the present invention are a process for fabricating microchannels on a substrate and a substrate comprising such microchannels. It is especially applicable to the fabrication of microstructured substrates intended to be used in microelectronic and/or microfluidic and/or micromechanical systems.

Such microchannels on a structured substrate are of great interest in three main fields: integrated circuits, in which it is desired to create air-filled volumes or spaces in interconnected structures for the purpose of minimizing the dielectric constant (P. A. Kohl, Q. Zhao, K. Patel, D. Schmidt, S. A. B. Allen, R. Shick and S. Jayaraman, "Air-Gaps for Electrical Interconnections", Electrochemical Solid-State Letters, 1, 49-51, (1998)); investigations in the mechanics of fluids on a micron scale (B. Zhao, J. S. Moore and D. J. Beebe, "Surface-Directed Liquid Flow Inside Microchannels", Science, 291, 1023-26, (2001)); and microfluidic devices such as "bio-MEMS" (bio-MicroElectroMechanical Systems) or "chemical-MEMS" (chemical-MicroElectroMechanical Systems), biosensors and "lab-on-chips" (E. Delamarche, A. Bernard, H. Schmid, B. Michel and H. Biebuyck, "Patterned Delivery of Immunoglobulins to Surfaces Using Microfluidic Networks", Science, 276, 779-781, (1997) and A. Treizebré and B. Bocquet, "Nanometric metal wire as a guide for THz investigation of living cells", International Journal of Nanotechnology, 5 (6/7/8), 784-95, (2008)).

It will therefore be understood that at the present time there is increasing interest in developing rapid and inexpensive methods for fabricating such microchannels.

Many techniques for fabricating microfluidic circuits are known. These are predominantly etching techniques, replication processes essentially based on molding a polymer material, and the use of a sacrificial material.

Among etching techniques, those described by M. J. Boer, R. W. Tjerkstra, J. W. Berenschot, H. V. Jansen, G. J. Burger, J. G. E. Gardeniers, M. Elwenspoek and A. Van den Berg "Micromachining of Buried Micro Channels in Silicon", IEEE J. MEMS, 9, 94-103, (2000) and by V. K. Dwivedi, R. Gopal and S. Ahmad in "Fabrication of very smooth walls and bottoms of silicon microchannels for heat dissipation of semiconductor devices" Microelectronics Journal, 31, 405-410, (2000)) are known.

Among replication processes based essentially on molding a polymer material, those described by J. C. McDonald and G. M. Whitesides in "Poly(dimethylsiloxane) as a material for fabricating microfluidic devices", Acc. Chem. Res., 35, 491-499 (2002) and by R. D. Chie in "Micromolding of biochip devices designed with microchannels", in Sensors and Actuators, A: Physical, 128, 238-247 (2006) are known.

Among techniques based on the use of a sacrificial material, that described by B. A. Peeni, M. L. Lee, A. R. Hawkins and A. T. Woolley in "Sacrificial layer microfluidic device fabrication methods", Electrophoresis, 27, 4888-4895 (2006) is known.

The main drawbacks with both etching techniques and polymer molding techniques are their inflexibility for adapting to various materials for the bottom layer, the need to use several photolithographic masks, thereby increasing the number of time-consuming steps, and the need to use methods for aligning and bonding the various layers fabricated.

These various steps furthermore generally require heat or chemical treatments that may lead to misalignment of one wafer with respect to another. As an example, the following may be mentioned: R. Chatterjee, M. Fayolle, P. Leduc, S. Pozder, B. Jones, E. Acosta, B. Charlet, T. Enot, M. Heitzmann, M. Zussy, A. Roman, O. Louveau, S. Maitrejean, D. Louis, N. Kernevez, N. Sillon, G. Passemard, V. Po, V. Matthew, S. Garcia, T. Sparks and Z. Huang "Three-dimensional chip stacking using a wafer-to-wafer integration", International Interconnect Technology Conference, IEEE, 4-6 June, pp 81-83 (2007).

The sole technique enabling simple and rapid fabrication of microchannels on one side of a silicon wafer is the technique using a sacrificial material.

According to this technique, the fabrication of a microchannel consists in depositing a sacrificial layer and in producing patterns of desired shapes in this layer.

A structuring material is then deposited on the patterned sacrificial layer.

After making access points open for etching in the walls of the channel, the sacrificial material is dissolved, chemically or thermally, or else by plasma etching, thus leaving a closed channel in place.

Various kinds of material are generally used for the sacrificial layer, such as photosensitive materials, mainly photoresist electronic materials, thermally decomposable materials such as polycarbonate, polyoxymethylene, polynorbornene and parylene, and water-soluble materials such as (poly) acrylic acids and polyvinyl alcohols.

For example, the following publications may be mentioned: K. Walsh, J. Norville and Y.-C. Tai, "Photoresist as a sacrificial layer by dissolution in acetone", 14th IEEE International Conference on MicroElectroMechanical Systems, p. 114-117, (2001); J. P. Jayachandran, H. A. Reed, H. Zhen, L. F. Rhodes, C. L. Henderson, S. A. B. Allen and P. A. Kohl, "Air-Channel Fabrication for Microelectromechanical Systems via Sacrificial Photosensitive Polycarbonates", IEEE J. MEMS, 12, 147-159 (2003); L. S. Gleason and K. K. Gleason, "Hot filament chemical vapor deposition of polyoxymethylene as a sacrificial layer for fabricating air gaps", Electrochemical Solid-State Letters, 4, G81-G84 (2001); D. Bhusari, H. A. Reed, M. Wedlake, A. M. Padovani, S. A. B. Allen and P. A. Kohl, "Fabrication of air-channel structures for microfluidic, microelectromechanical, and microelectronic applications", IEEE J. MEMS, 10, 400-408 (2001); X. Wu, H. A. Reed, Y. Wang, L. F. Rhodes, E. Elce, R. Ravikiran, R. A. Shick, C. L. Henderson, S. A. B. Allen and P. A. Kohl, "Fabrication of Microchannels Using Polynorbornene Photosensitive Sacrificial Materials", J. Electrochem. Soc., 150, H205-H213 (2003); H. S. Noha, Y. Choib, C. F. Wu, P. J. Heskethaand and M. G. Allen, "Rapid, low-cost fabrication of parylene microchannels for microfluidic applications", 12th International Conference on Solid-State Sensors, Actuators and Microsystems, Boston, Jun. 8-12 (2003); and V. Linder, B. D. Gates, D. Ryan, B. A. Parviz and G. M. Whitesides, "Water-Soluble Sacrificial Layers for Surface Micromachining", Small, 7, 730-6 (2005).

As regards the surface-deposited layer of the structuring material, the technique most widely used is the chemical vapor deposition (CVD) of silicon dioxide ($SiO_2$), silicon nitride ($SiN_x$), silicon carbide (SiC) or various metals such as aluminum (Al), nickel (Ni) and titanium (Ti).

However, these materials are deposited at high temperatures, generally at 200° C. or higher. This therefore requires the use of materials exhibiting high thermal stability and a high glass transition temperature. It also means that adhesion layers have to be used.

Such constraints considerably limit the number of materials that can be used.

Moreover, with the known techniques it is not possible to create, on the same substrate, and during a single fabrication process, channels varying in width from a few microns to several hundred microns.

In particular, the creation of microchannels of large width (several hundred microns) may result in the upper layer collapsing, reducing the flow cross section in the channel or even completely blocking this channel, unless the channels are reinforced by kinds of pillars.

Conversely, the creation of microchannels of small width (a few microns) absolutely requires the use of a sacrificial layer.

Furthermore, it is difficult to obtain channels in a cross section of varied and controlled geometry, especially because of the difficulty in controlling the way in which the surface layer that will close the channels is deposited.

The object of the present invention is therefore to provide a solution to the aforementioned problems, among other problems.

For this purpose, one subject of the present invention is a simple process for fabricating microchannels that are at least partially closed (over their length) or at least partially covered, based on an alternative technology called PPMS (Plasma Polymerization on Micropatterned Surface) technology.

More precisely, the process of the invention is based on deposition by plasma polymerization of a coating material at a temperature above room temperature.

This plasma polymerization is of the PECVD (Plasma-Enhanced Chemical Vapor Deposition) type or optionally RPECVD (Remote Plasma-Enhanced Chemical Vapor Deposition) type.

According to this technique, an organic and/or organometallic monomer is converted to a crosslinked polymer via a partial decomposition activated by high-energy plasma species.

These processes are accompanied by the consecutive deposition of thin polymer films on the bottom layer.

One of the main advantages of this plasma polymerization according to the invention is that it takes place at moderate temperature, compared with conventional plasma methods.

This makes it possible to use a wide range of materials for the sacrificial layer or encapsulated layer.

These advantages stem from the fact that the film thus deposited by this specific plasma polymerization exhibits strong biocompatibility, good adhesion to various types of bottom layer, and very useful surface properties both in the case of microfluidic flow and in the case of functionalization.

Specifically, the invention thus relates, according to a first aspect, to a process for fabricating at least one microchannel, closed over at least part of its length, on a substrate, especially for the purpose of creating a microstructured substrate.

The expression "channel closed over at least part of its length" is understood to mean an at least partly covered channel or even a channel having at least one part in the form of a tube (optionally of variable cross section).

The process comprises a step of producing at least one or at least two patterns on the surface of a bottom layer and a step of depositing, on top of the bottom layer and of the one or two patterns, a layer of polymer material.

Characteristically, the step of depositing the layer of polymer material comprises a step of polymerizing an organic or organometallic monomer in a PECVD (Plasma-Enhanced Chemical Vapor Deposition) reactor or optionally an RPECVD (Remote Plasma-Enhanced Chemical Vapor Deposition) reactor.

This monomer contains siloxane functional groups, preferably tetramethyldisiloxane.

The step of depositing the layer of polymer material is carried out so as to create, in place of the pattern and after a development step by decomposing this pattern, or between the two patterns without a development step by decomposing these two patterns, a channel closed over at least part of its length.

It is thus possible, by virtue of this process, to create one or more channels in the substrate that have variable dimensions, in particular widths that vary from a few microns to a few hundred microns, and variable geometries (circular or rectangular cross sections).

The process for growing the structuring polymer material, in particular if the monomer precursor is or comprises tetramethyldisiloxane (TMDS or TMDSO), makes it possible, in combination with patterns of variable geometry and size, to obtain a wide range of channels.

The layer of polymer material thus acts as an envelope at least partly closing the channels, while modifying the geometry of the patterns by the process of growing the polymer material, for example by forming excrescences generating, for the patterns, and therefore for the channels, the variable shapes and sizes.

The good mechanical properties of the material forming the structuring polymer layer closing the channels also participate in the possibility of forming channels of variable geometry and size, especially because of a good elastic modulus (strength, flexibility) partly due to the presence of the Si—O—Si group.

Several implementation variants of the process of the invention, which may be considered by themselves or in combination with any one or more other variants, are presented below.

The monomer used in the step of depositing the layer of polymer material may contain siloxane functional groups having no labile hydrogen, preferably hexamethyldisiloxane.

The step of producing the one or two patterns may comprise a step of depositing a photoresist layer on the bottom layer and a step of producing the one or two patterns in this photoresist layer by photolithography.

The photoresist layer may for example be deposited by spin coating or by plasma polymerization.

Alternatively, the step of producing the one or two patterns may comprise a step of direct etching in the bottom layer.

The one or two patterns then correspond to one or more unetched parts of the bottom layer.

The one or two patterns preferably have a height H of between 1 and 30 µm, so as to create, in place of said pattern (2) or between said two patterns (2), a channel having a height H of between 1 and 30 µm.

The pattern may have a width L of between 5 and 1000 µm, preferably between 100 and 1000 µm, so as to create, in place of the pattern, a channel having a width L of between 5 and 1000 µm, preferably between 100 and 1000 µm.

In the case in which two patterns are produced, these two patterns may be spaced apart by a distance L not exceeding 5 µm, preferably not exceeding 4 µm, so as to create, between these two patterns, a channel having a width L not exceeding 5 µm, preferably not exceeding 4 µm.

The invention also relates, according to a second aspect, to a process for fabricating at least two microchannels, closed over at least part of their length, on a substrate, especially for the purpose of creating a microstructured substrate.

Characteristically, the process includes a step of creating a first microchannel with a width L not exceeding 5 µm, preferably not exceeding 4 µm, as explained above, and a step of creating a second microchannel with a width L of between 5 and 1000 µm, preferably between 100 and 1000 µm, as explained above.

Preferably, this process comprises a single step of depositing a layer of polymer material on top of both the bottom layer and the patterns.

It is thus possible, with the same simple and inexpensive process, especially with a single pattern production step, a single step of depositing the structuring material and a single step of developing certain patterns by decomposition, to produce, in one and the same substrate, a plurality of microchannels, the width of which varies from 1 to 1000 µm, i.e. from a few microns to a few hundred microns.

The invention also relates, according to a third aspect, to a substrate, especially of the microstructured type, intended for example for forming all or part of a microelectronic and/or microfluidic and/or micromechanical system.

Characteristically, the substrate comprises at least one channel fabricated by the process according to the first aspect of the invention or at least two channels fabricated by the process according to the second aspect of the invention.

Other features and advantages of the invention will become more clearly and more fully apparent on reading the following description of preferred implementation variants of the process and of embodiments of the substrate, which are given by way of nonlimiting example and with reference to the following appended drawings.

Figure 1:
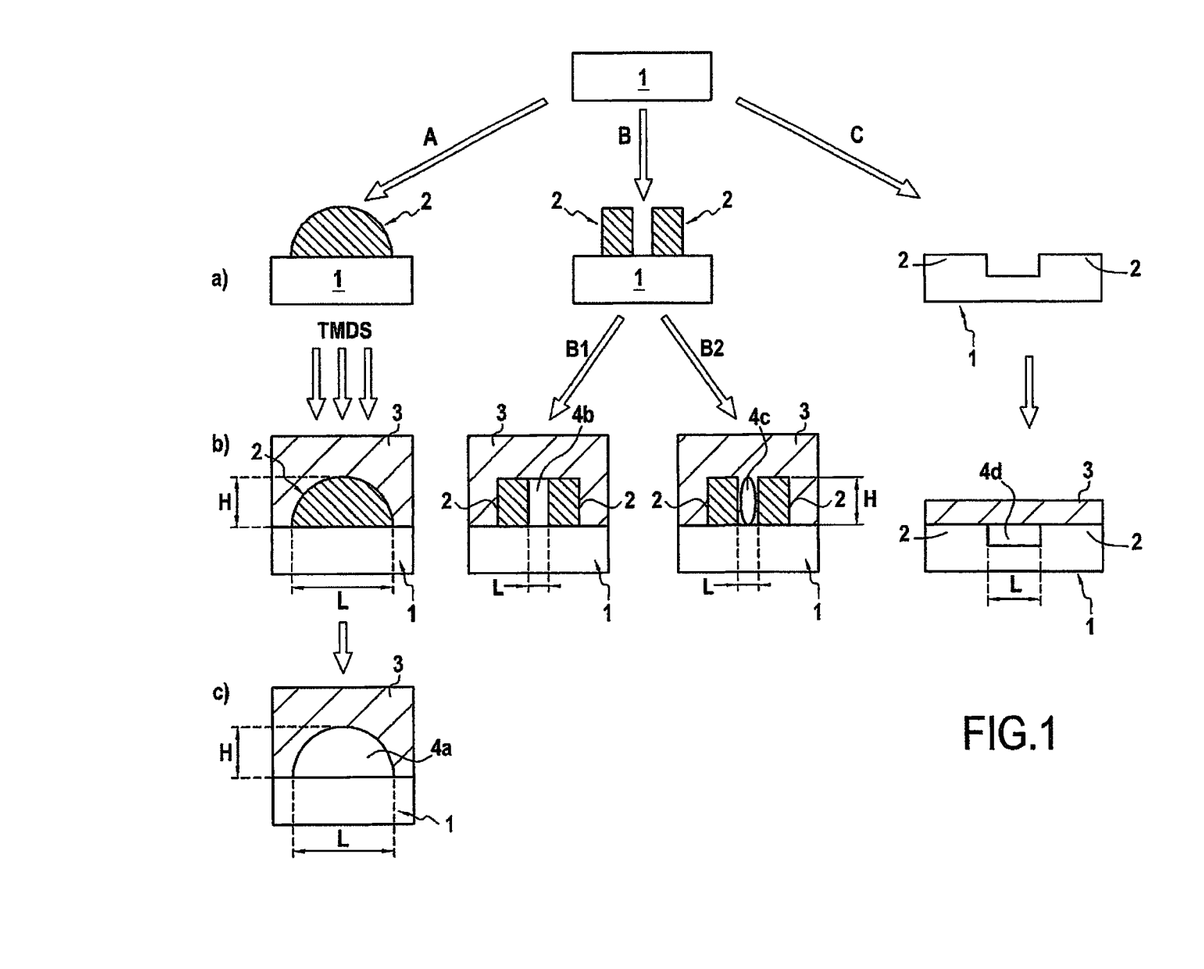
FIG. 1 shows schematically various implementation variants of the process of the invention.

Specifically, a first variant A follows branch A in FIG. 1, a second variant follows branch B in this FIG. 1 and a third variant follows branch C in this FIG. 1.

Branch B divides into a branch B1 and a branch B2, so that the second variant B divides into a variant B1 and a variant B2.

Firstly, whatever the variants, a step (a) is carried out in order to produce patterns 2 on a bottom layer 1, for example a silicon wafer 1.

These patterns 2 may be produced by a conventional two-step photolithography technique. Firstly, the sacrificial material consisting of a positive photoresist material is deposited on the bottom layer 1, for example by a spin-coating process. The spin and viscosity parameters of the polymer solution used serve to control the thickness of the deposited layer, which determines the height H of the patterns 2.

Next, the deposited material is cleaned so as to allow the solvent used to evaporate. The material is then exposed to UV radiation through a high-resolution mask. The zones not exposed to the UV are dissolved by immersing the substrate in a basic solution, revealing the sacrificial layer with the patterns 2 on the bottom layer 1.

As an example, the parameters used for this step (a) of producing the patterns 2 by photolithography, for a thickness of around 25 µm of the patterns 2, may be the following:
1. first spin-coating pass (for example with resist AZ 9260):
   speed: 2000 rpm
   acceleration: 5000, 40 s
   stabilization: 10 min.
   curing: 100° C. for 3 min.
   water reabsorption: 15 min at room temperature;
2. second spin-coating pass (for example with resist AZ 9260):
   speed: 2000 rpm
   acceleration: 5000, 40 s
   stabilization: 10 min.
   curing: 100° C. for 3 min.
   water reabsorption: 15 min at room temperature;
3. UV exposure: 365 nm for a dose of 10 mJ/cm$^2$ for 45 seconds;
4. development: dissolution in an AZ 351b solution for 90 seconds; and
5. final curing: 100° C. for 1 min.

In the variant corresponding to branch A, at least one pattern 2, the width L of which may be around several hundred microns, up to 1000 microns, is created.

This width L will moreover be equal to or greater than 5 microns (preferably greater than 100 microns), since below this value the resolution limit of the next step (b) of depositing the structuring material, which is around 4 microns, is reached. In fact, below this value, the subsequent deposition in step (b) will not take place uniformly around the pattern 2 and on the bottom layer 1, leaving an uncovered volume along the sidewalls of the pattern 2, and therefore in the end a channel having a width not controlled by the width L of the pattern 2.

In the two variants corresponding to the two branches B1 and B2, at least two patterns spaced apart by a width L equal to or below the abovementioned resolution (around 4 microns) are created in variant B1, or above this resolution value but of around a few microns (preferably around 5 microns) in variant B2. Indeed, for variant B2, beyond a few microns above the resolution value the subsequent deposition step (b) will result in the complete obstruction of the space between the two patterns 2 and therefore in the end in the impossibility of creating a channel without removing or developing the patterns 2.

In the variant corresponding to branch C, the two patterns are obtained by direct etching in the bottom layer 1. As in the case of variant B, dividing into a variant B1 and a variant B2, variant C may be subdivided into two variants, only the first of which has been shown in FIG. 1 for simplification.

In this first variant in FIG. 1 relating to branch C, the etching width L is equal to or below the abovementioned resolution (around 4 microns). The other variant, not shown in FIG. 1, relating to this branch C, the etching width L is above this resolution value but around a few microns (preferably around 5 microns). In this variant C, the filling of the resulting trench with the sacrificial resist used in both variants A and B may also be advantageously carried out so as to maintain and/or form the plasma polymer for covering the channel.

Specifically, the following step (b) consists in depositing the upper layer 3 of structuring material on the surface of the substrate, i.e. on top of the patterns 2 and the bottom layer 1.

This step is of the plasma polymerization type, the substrate being placed in a reactor (see below for explanations relating to FIG. 2).

In step (b), an organic or organometallic monomer precursor is used to synthesize and deposit the polymer film by a PECVD or optionally RPECVD technique.

The monomer thus polymerized by plasma polymerization constitutes the structuring material 3 of the microchannels 4, 4a, 4b, 4c, 4d that will be created (directly in step (b) for both variants B1 and B2 and for variant C, or in step (c) for variant A).

The deposition is carried out at room temperature, this being a major advantage.

Given below by way of example are the parameters of step (b) for depositing the layer (3) of structuring material (step (b) being described below in greater detail with reference to FIG. 2):

base pressure: 28 Pa;
operational pressure: 560 Pa;
power: 200 W;
plasma gas: $N_2$ (1.8 standard liters/min);
carrier gas: $O_2$ (25 standard $cm^3$/min);
pretreatment: $N_2$ plasma for 4 min and then $N_2/O_2$ plasma for 3 min; and
deposition: TMDSO plasma (5 standard $cm^3$/min).

The last step, as shown in FIG. 1, relates only to variant A. During step (c), the sacrificial layer having served for producing the pattern 2 is removed. This step is referred to as development, by decomposing the pattern 2.

This development step is carried out by immersing the entire assembly (substrate comprising the bottom layer 1, the pattern 2 and the structuring layer 3) in a development solution, for example of the AZ 351 B type, prepared using deionized water.

The pattern 2 made of photoresist sacrificial material, decomposes to volatile and soluble products, leaving a volume 4a that extends between the bottom layer 1 and the structuring polymer layer 3, thereby forming a channel 4a.

It should be noted that, in the example shown in FIG. 1, variant A, the channel 4a obtained after step (c) has a rounded shape in the upper portion because of the rounded shape in the upper portion of the pattern 2 used in step (b).

However, and preferably, a channel 4a of geometry substantially identical to that shown in FIG. 1 is obtained with a pattern truncated in the upper part, i.e. with rounded sidewalls but a substantially planar top wall.

This is because the lithographic process used in step (a) for producing the pattern 2 results in the rounding of the sidewalls but not (or only with difficulty) of the top wall.

In this case, it is the deposition process in step (c) which, because of greater constraint at the base of the patterns, causes rounded polymerization in the upper part, above the substantially planar top wall of the pattern 2. Thus, after step (c), a rounded channel 4a as shown in FIG. 1 is therefore obtained from a pattern 2 having a substantially planar top wall.

The development step (c) of decomposing the pattern 2 is not carried out neither in either of variants B1 and B2 or in variant C.

This is because, owing to the size of the space separating the two patterns 2 in variants B1 and B2 and in variant C, which is around a few microns, and as explained above, the polymerization of the monomer during step (b) does not fill this space. In other words, there is virtually no or little deposition of the structuring polymer layer 3 in this space.

Specifically, in variant B1 as in variant C, the two patterns 2 are separated by a distance L equal to or below the deposition resolution of the structuring polymer layer 3 (around 4 microns) so that the practically no polymerization takes place in the space separating the two patterns 2. This results in the formation of a channel 4b (in the case of variant B1) or 4d (in the case of variant C) having a substantially rectangular cross section between the two patterns.

Moreover, in variant B2, the two patterns 2 are separated by a distance L which is greater than the deposition resolution of the structuring polymer layer but remains around a few microns, preferably not exceeding 5 microns, so that the polymerization takes place partly along the vertical walls of the facing patterns 2 in the space separating these two patterns 2, with an accumulation of polymer in the top and bottom parts of these vertical walls and very little polymer, or even no polymer at all, on the central part of these vertical walls and on the bottom layer 1 at the centre of the space separating the two patterns 2. This results in the formation of a channel 4c having a substantially circular cross section between the two patterns.

In variant B2, if the space between the two patterns 2 is greater than a few microns, already greater than 5 microns, the polymerization tends to completely fill the space between the two patterns 2. The situation is then as that of variant A and there is a need for a development step (c) that enables the patterns 2 to be removed and leaves two channels in place of these two patterns 2.

As already mentioned above, another variant of variant C is possible that corresponds to variant B2 in terms of the spacing of the patterns and the geometry of the channel obtained, but by etching in the bottom layer 1 in order to form the patterns 2.

In all these variants, the channels (or microchannels) 4a, 4b, 4c, 4d are optically transparent, especially owing to the properties of the precursor monomer used for depositing the structuring layer 3.

Figure 3A:
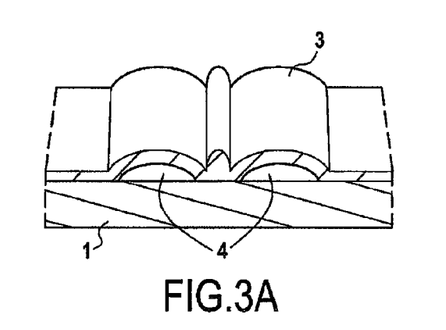
FIGS. 3a, 3b, 3c show schematically examples of microchannels obtained by the process of the invention.
Figure 3B:
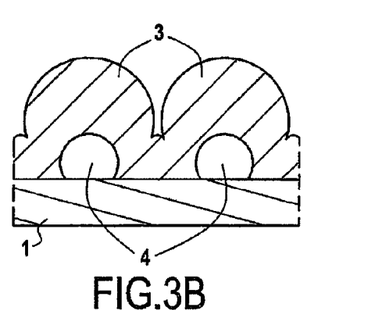
Figure 3C:
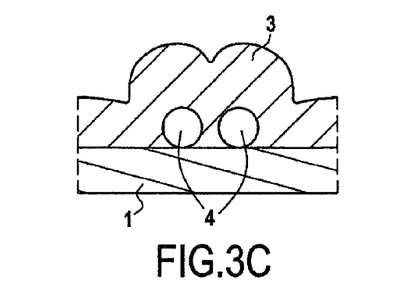

Thus, FIGS. 3a, 3b and 3c show typical examples of channels 4 formed by the process of the invention with the deposition of the structuring polymer layer 3 as explained above on a silicon bottom layer 1.

In FIG. 3a, the widths of the channels 4 are much greater than their heights, whereas in FIGS. 3b and 3c the widths of the channels 4 are substantially the same as the heights, having a partially circular cross section (FIG. 3b) and an almost circular cross section (FIG. 3c).

The structures obtained may be advantageously rinsed in deionized water before being dried by supercritical $CO_2$ so as to avoid the sticking effect caused by the capillary forces.

Figure 4:
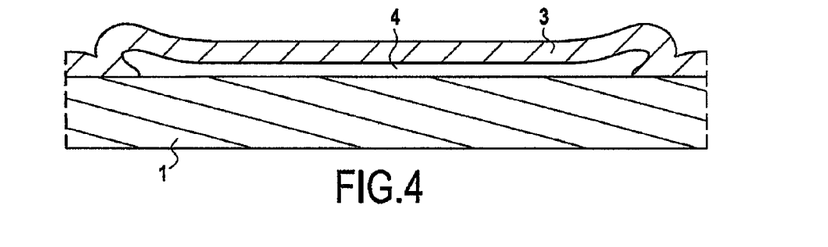
FIG. 4 shows schematically an example of a wide microchannel obtained by the process of the invention.

The example shown in FIG. 4 illustrates the result of the process of the invention for forming a channel 4 with a width of several hundred microns, very much greater than its height.

It has been found that, despite the large width of the channel 4 and the absence of support pillars, the structuring polymer layer 3 does not collapse onto the bottom layer 1. A kind of beading may simply be observed along the sidewalls, resulting from the "cap" phenomenon during polymerization along the upper edges of the patterns 2.

Step (b) of plasma-polymerizing the monomer used to form and deposit the structuring polymer layer 3 is explained in greater detail with reference to FIG. 2.

The bottom layers receiving the microcircuits rest on the support plate of a PECVD or optionally RPECVD reactor, possibly using a suitable fastening system.

The support plate is then placed in the RPECVD deposition reactor, which is then closed.

The position of the support plate may be adjusted using a positioning system controlled by a suitable system.

Figure 2:
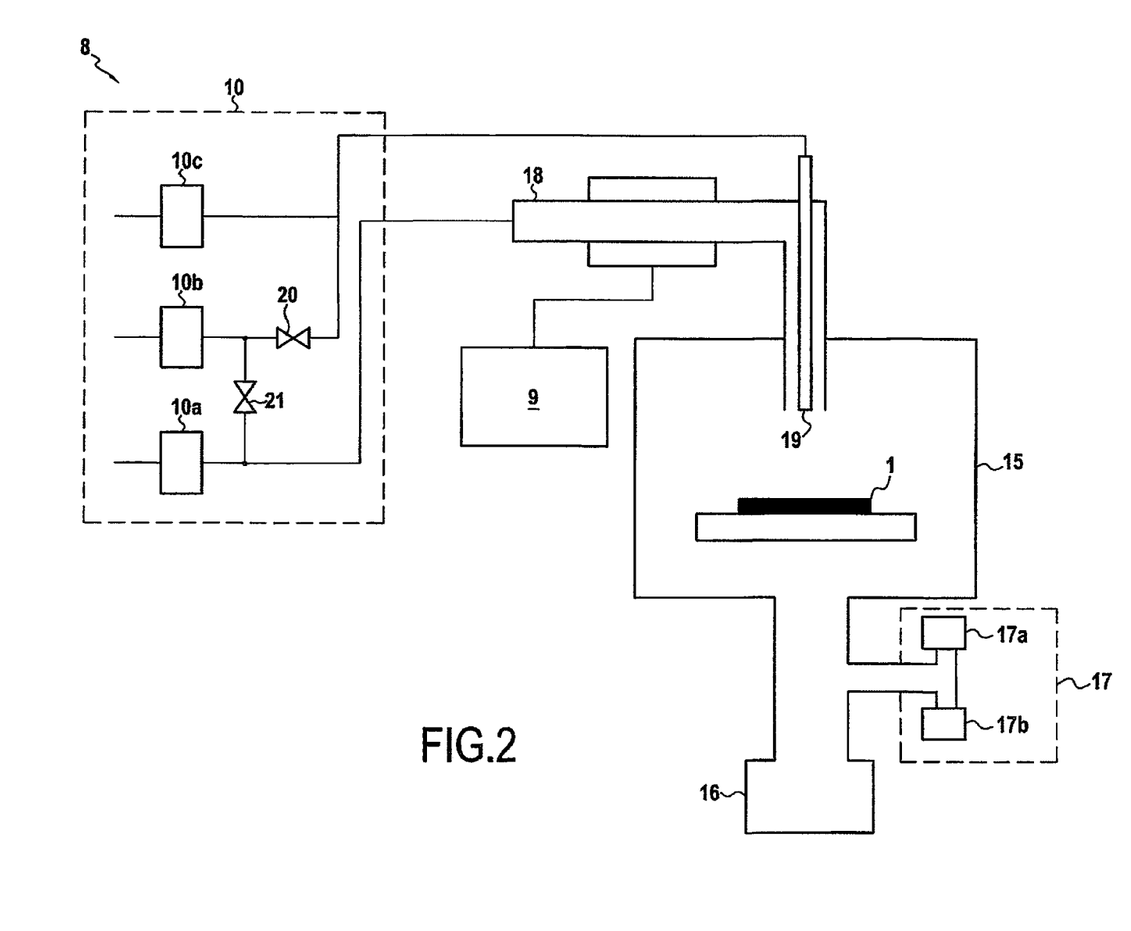
FIG. 2 shows schematically the principle of remote plasma-enhanced chemical vapor deposition.

FIG. 2 therefore shows schematically one example of the structure of an RPECVD deposition reactor employed. The reactor 8 comprises four zones: the plasma generator 9; the gas injection system 10; the deposition chamber 15; and the pumping auxiliary 16.

The pump or pumps 16 serve to create a low pressure in the chamber 15 of the reactor 8. In this way, the liquid-vapor equilibrium of the chemical species used during the process is shifted in favor of vaporization of the compounds. The pressure within the reactor 8 may be permanently monitored and controlled using a measurement gauge 17 (for example a capacitive gauge 17a and a Pirani gauge 17b).

The gas injection system 10 feeds gas into a feed duct 18 made of glass or fused silica and into a coaxial nozzle 19 made of the same type of material. The main duct 18 is supplied with nitrogen using a mass flow rate regulator 10a. The coaxial nozzle 19 is supplied with oxygen or with vaporized chemical compounds necessary for the growth process or with a mixture of these gases using mass flow rate regulators 10b and 10c respectively.

Two valves 20 and 21 may be used for controlling the $N_2/O_2$ pretreatment.

Thus, in this pretreatment (i.e. before the plasma treatment), the mixing valve 21 is opened and the valve 20 closed, so as to inject the $N_2/O_2$ mixture coming from the mass flow rate regulators 10a and 10b into the duct 18.

For the $O_2$ plasma treatment, it is then sufficient to close the mixing valve 21 and open the valve 20.

The plasma source is a coaxial applicator excited by a microwave generator, but it may also be based on any plasma source producing nitrogen atoms in the necessary quantity, possibly by adapting the working pressure range. One section of the duct 18 is subjected to the electromagnetic radiation upstream of the deposition chamber 15.

The nozzle 19 and the duct 18 open into the deposition chamber 15 where the bottom layer 1 to be treated has been placed.

The bottom layer 1, prepared beforehand outside the reactor and optionally exposed to just the remote nitrogen plasma discharge for a final cleaning, is then exposed to the reaction mixture enabling polymeric films to be deposited on the surface thereof, without exposing the pretreated specimens to air again.

The oxygen and polymer precursor flow rates are regulated. This gas mixture is injected via the coaxial nozzle 19 located upstream of the deposition chamber 15, which injection may result in the appearance of a cone of different luminosity from that of the gas in the remote discharge because of reactions with the highly energetic carriers of the remote discharge.

In a preferred embodiment, the polymer precursor used is tetramethyldisiloxane (TMDSO), a molecule having an oxygen bridge between two silicon atoms. These atoms also each carry two methyl groups and one hydrogen atom.

During its exposure to the excited nitrogen of the remote discharge, the TMDSO is fragmented into various extremely reactive radical species. These react inter alia with the radial nitrogen and oxygen present in the gas mixture and with inter alia the material of the bottom layer 1. The typical film deposition rates are of the order of 10 nm/s.

More generally, monomers of the same family may be used in two approaches:
  monomers containing siloxane functional groups having similar or different structures (cyclic molecules, cages) such as tetramethylcyclotetrasiloxane (TMCTSO), which may have a larger number of oxygen bridges and one or more labile hydrogen atoms linked to the silicon and
  monomers containing siloxane functional groups having characteristics identical to those mentioned above but containing no labile hydrogen, such as hexamethyldisiloxane (HMDSO).

In this second approach, the preferred method will include a modification of the process, either by the use of additives to the nitrogen used to generate the plasma in this same configuration (a gas line must then be added to this purpose to the gas injection system 10 in the example of the structure of the reactor shown in FIG. 2), or by shifting the point of injection of the polymerizing mixture to a position more upstream, or else by jointly placing the point of injection of said mixture and the bottom layer in the ionized medium generated by the plasma (in PECVD or RPECVD mode).

In the latter case, the $N_2$ gas may be substituted, for example, by argon or helium and the plasma (whether pulsed or not) generated at low average electromagnetic power so as to preserve the skeleton of the deposition precursor. Thus, energy and physico-chemical conditions approaching those of the RPECVD described in the preferred embodiment are recreated. The geometries of the reactor in this case have to be modified so as to allow the bottom layer 1 to be immersed.

It should be noted that the latter configuration is also compatible with the use of a siloxane precursor having a labile hydrogen.

The polymer deposition phase takes place by molecular attachment of organosilicon fragments of various sizes. Other fragments, recombined or not, then become attached at these points.

A relatively crosslinked network of molecular filaments, consisting mainly of —$(CH_3)_2SiO$— based chains in the preferred embodiment, grows from these attachment points.

The entanglement of these filaments and the crosslinking thereof lead to the formation of depositions having a morphology of amorphous or slightly structured polymer films. The thickness of the films obtained depends only on the $O_2$/TMDSO spray exposure time, all other parameters remaining identical.

As an example, a substrate produced according to the process of the invention may be used to fabricate a system of the BioMEMS (BioMicroElectro Mechanical System) type.

It is thus possible to integrate microfluidic circuits directly on a bottom layer supporting electrical or electromagnetic components.

Figure 5:
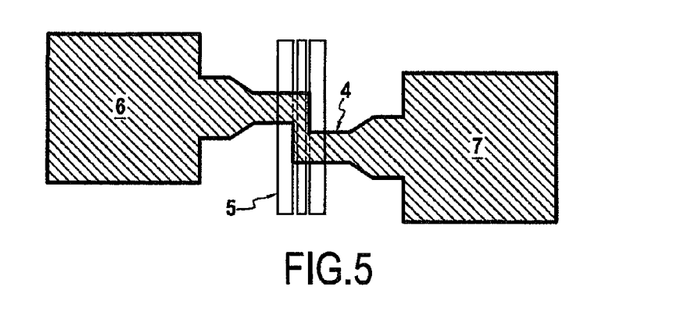
FIG. 5 shows schematically an example of a fluidic MEMS.

Specifically, the example shown in FIG. 5 comprises a bottom layer supporting a coplanar waveguide 5 on which a pattern of appropriate geometry may be deposited directly so as to form, after the aforementioned steps of the process of the invention have been carried out, a channel 4.

In this example, the two ends of the channel 4 are widened so as to move from a width ranging from a few microns to up to a few hundred microns to a width of 1 mm and to open into two reservoirs 6 and 7, the purpose of which is to promote fluidic access.

These reservoirs may be obtained by masking during deposition of the structuring layer by plasma polymerization and then using them as etching holes in the sacrificial layer.

It is thus possible with the process according to the invention to form microchannels at least partly closed (or covered) over their length, thanks in particular to the specific properties of the structuring polymer layer and to the RPECVD processes for depositing this layer.

In particular, the film deposited using a monomer precursor of the organic or organometallic type, such as TMDS (or TMDSO), exhibits good mechanical strength enabling wide channels to be produced without them collapsing during or after fabrication.

The process enables a wide variety of channel sizes and geometries to be obtained.

This is made possible not only due to the physical properties of the monomer used, but also to the specific mode of polymerization of the monomer, in particular along the edges of the patterns forming the structure on the bottom layer.

In addition to the advantage associated with its low cost and its suitability for mass production, the process of the invention has the advantage of enabling channels to be created with useful physical and chemical properties, such as transparency in the visible wavelengths, chemical stability with respect to the solvents used in the lithography processes and the relatively low permittivity (≈4) with little loss in the millimeter wave range and terahertz frequency range.

This is most particularly important for designing MEMS based on electromagnetic waveguides.

Furthermore, unlike most polymers, the polymer resulting from the plasma polymerization for a monomer precursor such as TMDSO is not self-fluorescent, enabling fluorescence detection techniques to be employed.

Such plasma polymerization makes it possible to achieve good adhesion to a wide range of bottom layers and thus to avoid using an additional adhesion layer.

Furthermore, the deposition resolution (distance between two patterns, below which the polymer film is not deposited between the two patterns) has been estimated in the case of the process of the invention to be approximately 4 µm.

This therefore makes it possible to create channels of very small width (<4 µm) without having to use a sacrificial material and a step of developing the sacrificial material by decomposition thereof.

As regards the bioMEMS example shown in FIG. 5, the applicant has been able to construct a microchannel 4 having a length of 2 mm and a height of 20 µm with a total volume of 23 nL.

The two reservoirs 6 and 7 serve as access for the etchant, as input and output ports and as surface tension suppliers enabling the channel 4 to be filled by capillary forces.

Capillary forces are largely predominant in microfluidic systems because of the high surface-to-volume ratio.

The surface tension provides the sufficient pressure for advancing the liquid along the channel 4. The flow of the liquid within channels having a size of the order of a micron is essentially laminar (with a Reynolds number<500 for the channel 4 in our example).

Despite the hydrophobic character of the structuring polymer layer used, it is not necessary to treat the surface so as to be able to fill the channel, unlike channels formed with a layer of hydrophobic polymer, such as PDMS which requires a prior hydrophilization treatment in order to allow positive capillary action.

This stems from three main factors: the capillary pressure produced by the liquid at the inlet of the channel at a reservoir, which enables the liquid to enter the channel; the periodic constrictions present in the internal walls of the channels, which promote capillary effects and displacement of the aqueous solutions along the surface of the channel; and the nonwettable internal walls of the channels.

Specifically, the capillary pressure may be given by the formula:

$$p = 2\delta\left(\frac{1}{h} + \frac{1}{w}\right) \quad (1)$$

where w is the width of the channel, h is its height and $\delta$ is its surface tension ($\delta(H_2O)=7.36\times10^{-2}$ N/m at 20° C.).

If the width of the reservoir is much greater than its thickness (its height), equation (1) may be simplified to $p=2\delta/h$.

The pressure difference at the inlet of the microchannel used in the example presented above relating to FIG. 5 is then $p=8.1\times10^7$ Pa.

This pressure drains the liquid at an initial velocity of 4.4 cm/s.

The fill rate is reduced at the end to 2.2 mm/s$^{-1}$ because of the pressure drop and the viscosity effects.

The fill rate is thus determined by the geometry of the channel, the surface energy of the channel and the properties of the liquid.

The periodic constrictions along the internal walls of the channel have, in the example relating to FIG. 5, a width and a height of 1 to 2 µm.

As indicated above, these constrictions promote capillary effects and displacement of the aqueous solutions along the surface of the channel.

This situation may also be very useful for functionalizing the channel, in so far as these constrictions generated reduce the velocity of the flow close to the surface, thereby increasing the residence time (i.e. the time during which the liquid remains in the channel) and therefore the surface interactions, thereby finally promoting adsorption and condensation of the molecules.

Finally, the internal walls of the microchannel are essentially nonwettable, only the silicon part being wettable with static contact angles $\theta(Si)=58°\pm3°$ and $\theta$ (polymerized TMDS)=95°±3°.

The total surface energies are: 41.7 mJ/m$^2$ (dispersive component $\gamma_d$=24.1 mJ/m$^2$; polar component $\gamma_p$=17.7 mJ/m$^2$) and 22.3 mJ/m$^2$ ($\gamma_d$=20.4 mJ/m$^2$; $\gamma_p$=1.9 mJ/m$^2$) for the respective hydrophilic and hydrophobic surfaces.

The polymerized TMDS internal walls generate a positive pressure that acts against the filling, whereas the surface tension force coming from the hydrophilic silicon surface in the bottom part reduces the effect of the polymerized TMDS and helps the liquid to flow through the channel.

Other factors that affect liquid slip, such as the roughness of the surface and the reduction in width of the channel, which act as passive valves, may also be mentioned.

Thus, the process of the invention makes it possible for microchannels of various shapes and sizes to be easily created with variable surface characteristics.

Furthermore, the process enables fluidic circuits to be directly and rapidly integrated into various sensors such as microelectrodes and waveguides.

The plasma polymerization makes it possible to dispense with bonding (or adhesion) steps in the fabrication protocol.

This operation is carried out at room temperature and allows the use of a wide range of organic or organometallic materials, for depositing the structuring polymer layer, which have useful biocompatible properties and are easily functionalizable.

Various materials may be used for the bottom layer without the use of a tie layer.

The process may easily be carried out on an industrial scale.

Furthermore, the process makes it possible to fabricate both channels having a large width (several hundred microns, exceeding 700 µm) without support pillars and channels having a small width (a few microns, less than 5 µm) without using a sacrificial technique.

The present description and particularly the examples presented above have been given to exemplify the invention and are therefore not limiting.

The invention claimed is:

1. A method for fabricating in a substrate at least two empty microchannels closed over at least part of their length, comprising:
   a step of producing a single pattern on the surface of a bottom layer, said single pattern having a width (L) of between 5 and 1000 µm,
   a step of producing a pair of patterns on said surface of a bottom layer, wherein the patterns in the pair are spaced apart by a distance (L) not exceeding 5 µm, and depositing a layer of polymer material in a single step simultaneously on top of said bottom layer, said single pattern, and said pair of patterns by polymerizing an organic or organometallic monomer containing siloxane functional groups in a plasma-enhanced chemical vapor deposition reactor so as to create between the two patterns in said pair, without a development step to decompose the two patterns in said pair, a first empty microchannel having a width (L) not exceeding 5 µm, and a development step to decompose said single pattern so as to create, in place of said single pattern, a second empty microchannel having a width (L) of between 5 and 1000 µm.

2. The method as claimed in claim 1, wherein the monomer used in the single step of depositing a layer of polymer material on top of the bottom layer, the single pattern and the pair of patterns contains siloxane functional groups having no labile hydrogen.

3. The method as claimed in claim 1, wherein the step of producing the single pattern and/or the pair of patterns on the surface of the bottom layer comprises a step of depositing a photoresist layer on the bottom layer and a step of producing the single pattern and/or pair of patterns in the photoresist layer by photolithography.

4. The method as claimed in claim 1, wherein the step of producing the single pattern and/or the pair of patterns on the surface of the bottom layer comprises a step of direct etching in the bottom layer, said single pattern and/or pair of patterns then corresponding to one or more unetched parts of said bottom layer.

5. The method as claimed in claim 1, wherein the single pattern and/or the pair of patterns have a height (H) of between 1 and 30 µm so as to create, in place of said single pattern and/or between the two patterns of the pair, a channel having a height (H) of between 1 and 30 µm.

6. The method as claimed in claim 1, wherein the single step of depositing a layer of polymer material on top of the bottom layer, the single pattern and the pair of patterns comprises a step of polymerizing an organic or organometallic monomer containing siloxane functional groups in a remote plasma-enhanced chemical vapor deposition reactor.

7. The method as claimed in claim 1, wherein the two patterns in a pair are spaced apart by a distance (L) not exceeding 4 µm, so as to create between said two patterns an empty channel having a width (L) not exceeding 4 µm.

8. The method as claimed in claim 1, wherein the monomer used in the single step of depositing a layer of polymer material on top of the bottom layer, the single pattern and the pair of patterns contains tetramethyldisiloxane or hexamethyldisiloxane.

9. A substrate comprising at least two microchannels fabricated by the method as claimed in anyone of claims 1, 2, and 5 to 8.

10. A substrate as claimed in claim 9, which is a microstructured substrate.

* * * * *